United States Patent
Perner

(10) Patent No.: US 6,842,390 B2
(45) Date of Patent: *Jan. 11, 2005

(54) SYSTEMS AND METHODS FOR COMMUNICATING WITH MEMORY BLOCKS

(75) Inventor: Frederick A. Perner, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/675,191

(22) Filed: Sep. 30, 2003

(65) Prior Publication Data

US 2004/0066691 A1 Apr. 8, 2004

Related U.S. Application Data

(63) Continuation of application No. 10/145,834, filed on May 14, 2002, now Pat. No. 6,678,200.

(51) Int. Cl.⁷ .................................................. G11C 7/02
(52) U.S. Cl. .............. 365/209; 365/230.03; 365/189.07
(58) Field of Search ........................... 365/209, 230.03, 365/189.07, 189.01, 230.06, 158, 157

(56) References Cited

U.S. PATENT DOCUMENTS

| 5,724,304 | A | 3/1998 | Foss |
| 6,272,066 | B1 | 8/2001 | Ooishi |
| 6,411,556 | B1 * | 6/2002 | Amano ........................ 365/200 |
| 6,678,200 | B2 * | 1/2004 | Perner ........................ 365/209 |

FOREIGN PATENT DOCUMENTS

EP        0478254 A2    4/1992

* cited by examiner

*Primary Examiner*—David Lam

(57) ABSTRACT

Systems and methods for reading from or writing to memory blocks, are provided. An embodiment of the system comprises a plurality of memory blocks; a plurality of repeaters; and a line that couples the memory blocks with the repeaters such that the repeaters can read from the memory blocks. One embodiment of the method comprises coupling the memory blocks to repeaters; and reading from the memory blocks.

12 Claims, 9 Drawing Sheets

US 6,842,390 B2

SYSTEMS AND METHODS FOR COMMUNICATING WITH MEMORY BLOCKS

CROSS-REFERENCE TO RELATED APPLICATION

This application is a continuation of U.S. utility application entitled, "Systems and Methods for Communicating with Memory Blocks," having Ser. No. 10/145,834, filed May 14, 2002, now U.S. Pat. No. 6,678,200 which is entirely incorporated herein by reference.

TECHNICAL FIELD

The present invention is generally related to data storage, and more particularly, is related to systems and methods for communicating with memory blocks.

BACKGROUND OF THE INVENTION

A magnetic random access memory (MRAM) device is a memory device that comprises a plurality of memory blocks, termed as MRAM blocks. Each MRAM block has word lines, bit lines, and memory cells, referred to as MRAM cells. The MRAM cells are used to store data and lie at intersections of word lines and bit lines.

In an MRAM device, there is a limit on the amount of data that can be written to the MRAM device since the MRAM device usually has a limited number of small-sized MRAM blocks or a limited number of large-sized MRAM blocks. The MRAM device has a limited number of large-sized MRAM blocks since usually a high value of write current drive voltage is required to write to large-sized MRAM blocks and cumulative read currents produced by consecutively reading from large-sized MRAM blocks interfere with reading from the MRAM blocks. A high value of write current drive voltage is usually required since the write current is fixed and large-sized MRAM blocks have high resistances which cause the high value of write current drive voltage to reduce as the MRAM blocks are written. Reading from large-sized MRAM blocks interferes with the read operation since consecutively reading from a large number of large-sized MRAM blocks generates a large amount of current that interferes with the read operation.

The MRAM device has a limited number of small-sized MRAM blocks since each small-sized MRAM block has peripheral circuitry that occupies a large amount of area on the MRAM device, thereby reducing any available area for the MRAM blocks. The peripheral circuitry typically includes decoders and drivers at each edge of a small-sized MRAM block. Hence, in an MRAM device, there is a limit on the amount of data that can be written to the MRAM device.

From the above, it can be appreciated that it would be desirable to have a memory device that has a large number of memory blocks, thereby allowing to store a large amount of data that is not limited by the constraints mentioned above.

SUMMARY OF THE INVENTION

The present invention provides systems and methods for communicating with memory blocks. Briefly described, in architecture, one embodiment of the system, among others, can be implemented as follows: a plurality of memory blocks; a plurality of repeaters; and a line that couples the memory blocks with the repeaters such that the repeaters can read from the memory blocks. The present invention can also be viewed as providing a method for communicating with memory blocks. In this regard, one embodiment of such a method, among others, can be broadly summarized by the following: coupling the memory blocks to repeaters; and reading from the memory blocks.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE INVENTION

The present invention relates to systems and methods for communicating with memory blocks. An embodiment of a magnetic random access memory (MRAM) block and an MRAM cell that the MRAM block comprises are described in FIGS. 1A and 1B, respectively.

Figure 1A:
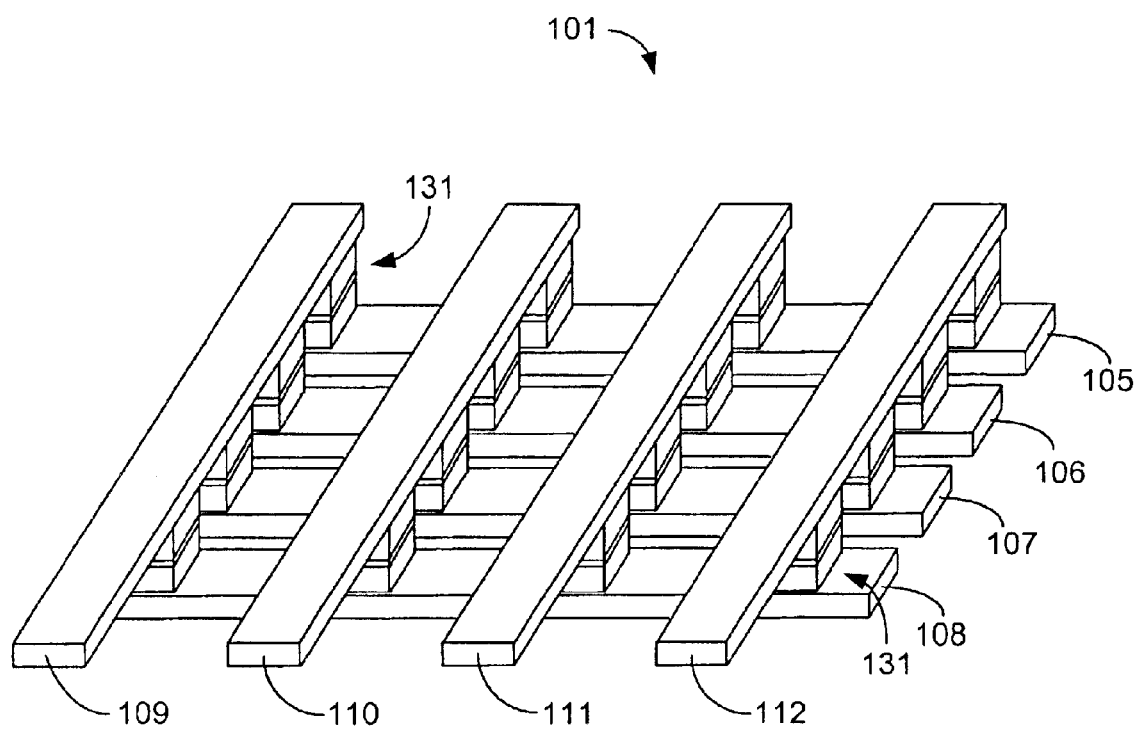
FIG. 1A is a schematic diagram of an embodiment of a magnetic random access memory (MRAM) block.

FIG. 1A is a schematic diagram of an embodiment of an MRAM block 101. The MRAM block 101 includes a set of word lines 105–108 and a set of bit lines 109–112. An MRAM cell is located at the intersection of each word line and a bit line. The MRAM block 101 may include any number of word lines, bit lines, and MRAM cells. For instance, a 64×64 MRAM block includes 64 word lines, 64 bit lines, and 4,096 MRAM cells. A 1024×1024 MRAM block includes 1024 word lines, 1024 bit lines, and 1,048,576 MRAM cells.

Figure 1B:
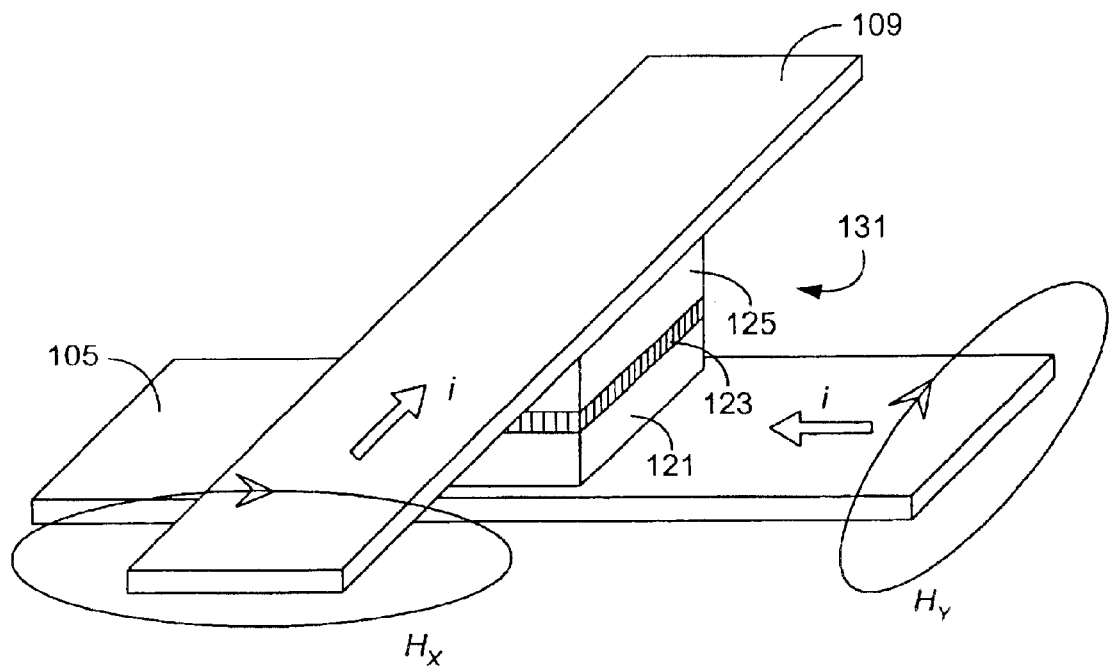
FIG. 1B is a schematic diagram of a close-up view of an embodiment of an MRAM cell of the MRAM block of FIG. 1A.

FIG. 1B is a schematic diagram of an embodiment of the MRAM cell 131. The MRAM cell 131 includes two ferromagnetic layers 121 and 125, and a tunneling junction 123 that is intermediate the ferromagnetic layers. The tunneling junction 123 is made of an insulating material. The layer 121 has a state of magnetism that is fixed and very difficult to change. Therefore, the layer 121 is typically referred to as a hard layer or a reference layer. The layer 125 has a state of magnetism that can be easily changed and therefore, the layer 125 is typically referred to as a soft layer or a data layer. Alternatively, the layer 125 can be a hard layer and the layer 121 can be a soft layer.

During a write operation, the MRAM cell 131 is written to by changing the state of magnetism of the layer 125 from a parallel state to an anti-parallel state of magnetism, or vice versa. To explain, a current i passes through the word line 105 and creates a magnetic field $H_y$. A current i passes through the bit line 109 and creates a magnetic field $H_x$. The magnetic fields $H_x$ and $H_y$ change the state of magnetism of layer 125 from parallel to anti-parallel or vice versa, thereby writing to the MRAM cell 131. For instance, if the state of magnetism of the layer 125 is changed from anti-parallel to parallel, a bit "1" is written to the MRAM cell 131. On the other hand, if the state of magnetism of the layer 125 is changed from parallel to anti-parallel, a bit "0" is written to the MRAM cell 131.

During a read operation, the MRAM cell 131 is read by measuring or sensing an amount of current that passes through the junction 123. To explain, if the state of magnetism of the layer 125 is parallel to the state of magnetism of the layer 121, a high amount of current will pass through the junction 123 since the junction 123 provides a low resistance. On the other hand, if the state of magnetism of the layer 125 is anti-parallel to the state of magnetism of the layer 121, a low amount of current will pass through the junction 123 since the junction 123 offers a high resistance. The high amount of current translates to, for instance, a bit "1", and the low amount of current translates to, for instance, a bit "0".

Figure 2:
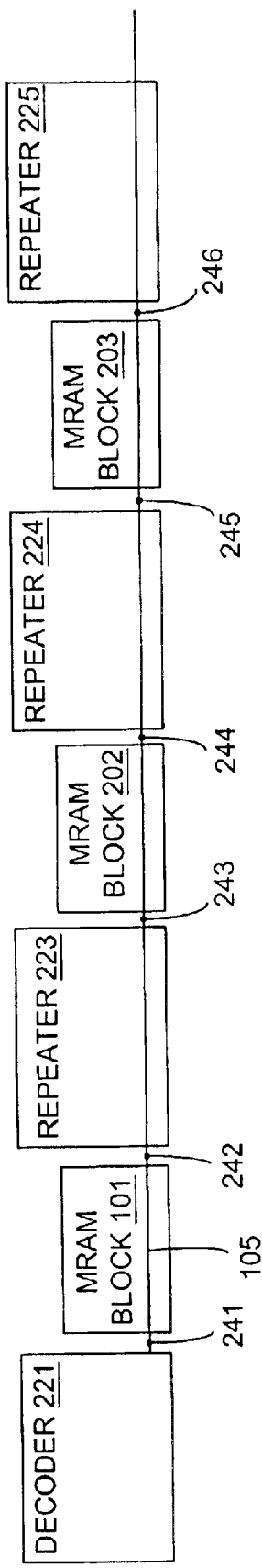
FIG. 2 is a block diagram of an embodiment of a system for communicating with memory blocks.
Figure 4:
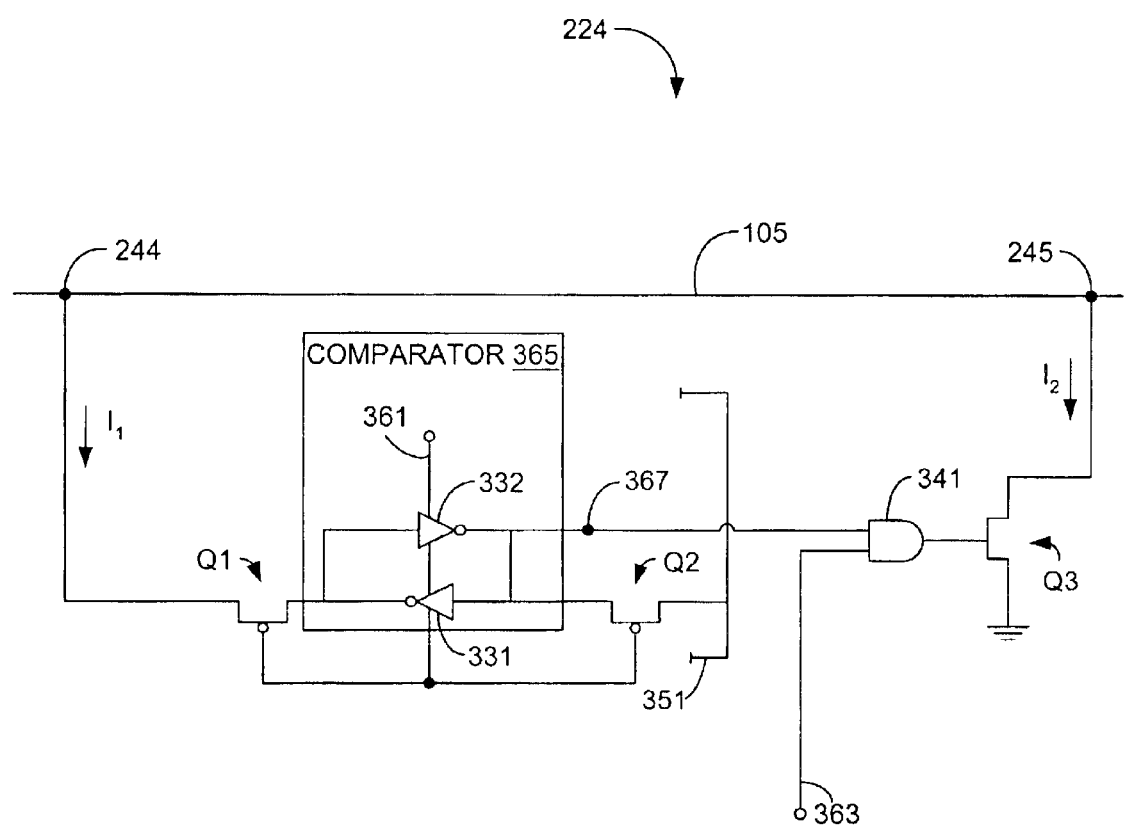
FIG. 4 is a circuit diagram of an embodiment of an even repeater of the system of FIG. 2.
Figure 6:
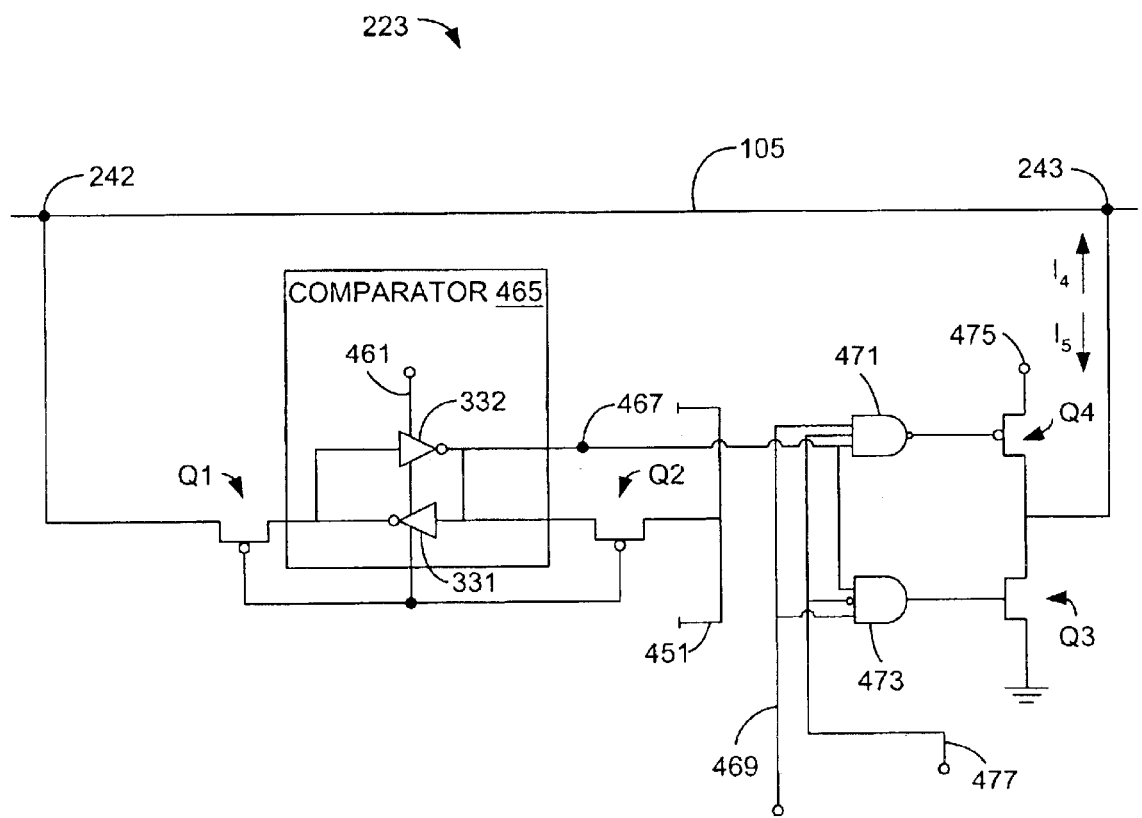
FIG. 6 is a circuit diagram of an embodiment of an odd repeater of the system of FIG. 2.

FIG. 2 is a block diagram of an embodiment of a system for communicating with memory blocks. It should be noted that some of the figures, for instance, FIGS. 2, 4, and 6 are described using the word line 105 as an example. The figures, alternatively, may be described using any of the word lines 106–108 (FIG. 1A) as an example. The system includes a decoder 221, repeaters 223–225, and the word line 105. A repeater that is adjacent and that follows an odd-numbered MRAM block is termed as an odd repeater. A repeater that is adjacent and that follows an even-numbered MRAM block is termed as an even repeater. For instance, the repeater 223 is an odd repeater since it follows the MRAM block 101 (FIG. 1) which is an odd-numbered MRAM block. The repeater 225 is an odd-numbered repeater since it follows an MRAM block 203, which is also an odd-numbered MRAM block. The repeater 224 is an even repeater since it follows an MRAM block 202, which is an even-numbered MRAM block. The system may include any number of MRAM blocks and any number of repeaters, and the number of repeaters is preferably the same as the number of MRAM blocks. In other embodiments of the system, the number of repeaters may not be the same as the number of MRAM blocks.

If the MRAM block 101 is a 1024×1024 MRAM block, the decoder 221 is a 10:1024 decoder. The MRAM blocks 202 and 203 are of the same size as that of the MRAM block 101. In such an arrangement, each of the MRAM blocks 202 and 203 has 1,048,576 MRAM cells since the MRAM block 101 preferably has 1,048,576 MRAM cells. However, the MRAM blocks 101, 202, and 203 may be of different sizes.

Word lines having the same address in each of the MRAM blocks 101, 202, and 203 are coupled to each other. To explain, a line that lies between nodes 242 and 243 couples the word line 105 (FIG. 1A) to a word line of the MRAM block 202. The word line of the MRAM block 202 lies between nodes 243 and 244, and has the same address as that of the word line 105. For instance, if the word line 105 is the 105th word line in the MRAM block 101, the word line of the MRAM block 202 is also the 105th word line of the MRAM block 202. A line that lies between nodes 244 and 245 couples the word line of the MRAM block 202 to a word line of the MRAM block 203. The word line of the MRAM block 203 has the same address as the word line of the MRAM block 202, and lies between nodes 245 and 246. Remaining word lines of the MRAM block 101 are coupled to remaining word lines of the MRAM block 202 in the same manner in which the word line 105 is coupled to the word line of the MRAM block 202. The remaining word lines of the MRAM block 202 are coupled to remaining word lines of the MRAM block 203 in the same manner in which the word line of the MRAM block 202 is coupled to the word line of the MRAM block 203. An output of the decoder 221 is coupled via a node 241 to the word line 105 of the MRAM block 101. The word line 105 is coupled to the word line of the MRAM block 202 and the word line of the MRAM block 203, thereby creating a line which is the same as the word line 105.

The system facilitates communication with a large number of MRAM blocks. In other words, the system allows simultaneously reading from or simultaneous writing to a large number of MRAM blocks, and therefore a large number of MRAM cells that each MRAM block comprises. For instance, the system can be used to simultaneously read from or simultaneously write to 102,400 MRAM cells if there are 100 MRAM blocks and each of the 100 MRAM blocks is a 1024×1024 MRAM block. This is possible due to the use of multiple repeaters 223–225 which virtually divides the word line 105 into stages, where each stage has one MRAM block and one repeater that is next to and follows the MRAM block. Each stage is read simultaneously to prevent the accumulation of current along the word line 105. As identified above, accumulation of current can occur if the MRAM blocks 101, 202, and 203 are read from consecutively. Moreover, each stage is written to simultaneously, thereby preventing the reduction of the current that is used to write to the memory cells along the word line 105.

During a read operation, a large number of MRAM blocks is defined as a number of MRAM blocks that are arranged in series, and from which an accumulation of current during the read operation interferes with the read operation. An example of an amount of current that interferes with the read operation is a current from 0.5 milliampere (mA) to 1 mA. During a write operation, a large number of MRAM blocks is defined as a number of MRAM blocks that are arranged in series and when written to, require a substantial amount of current. An example of a substantial amount of current is a current in the range of 1 mA to 5 mA.

During the read operation, each of the MRAM blocks 101, 202, and 203 can be read simultaneously since a low voltage is provided to nodes 241–246, which is preferably ground. A low voltage is provided to the node 241 since the decoder 221 selects the word line 105 by asserting a low voltage at the node 241. Similarly, a low voltage is provided to the nodes 242 and 243 since, as explained below in greater detail, the repeater 223 provides a low voltage to the node 243, thereby bringing the node 242 to a low voltage. A low voltage is provided to the nodes 244 and 245 since, as described below, the repeater 224 provides a low voltage to the node 245, thereby rendering the node 244 to be at the same voltage as the node 245. Finally, a low voltage is provided to the node 246 since the repeater 225 is an odd repeater and functions in the same manner as the repeater 223 that provides a low voltage to nodes at its input and output during the read operation. Hence, the read operation is performed by providing a low voltage to the nodes 241–246. Thus, the system permits reading from a large number of MRAM blocks.

The system also allows writing to a large number of MRAM blocks. The write operation is performed when the node 241 is at a low voltage, the nodes 242 and 243 are at a high voltage, the nodes 244 and 245 are at a low voltage, and the node 246 is at a high voltage. During the write operation, a current flows from the node 242 to the node 241 since the node 242 is at a high voltage and the node 241 is at a low voltage, thereby allowing to write to each of the MRAM cells of the MRAM block 101. Current flows from the node 243 to the node 244 since the node 243 is at a high voltage and the node 244 is at a low voltage, thereby allowing to write to the cells of the MRAM block 202. Current also flows from the node 246 to the node 245 since the node 246 is at a high voltage and the node 245 is at a low voltage, thereby allowing to write to the cells of the MRAM block 203. The node 241 is at a low voltage since the decoder 221 selects the word line 105 by bringing an output of the decoder 221 connected via the node 241 to the word line 105, to the low voltage. The nodes 242 and 243 are at a high voltage since, as explained below in greater detail, the repeater 223 provides a high voltage to the node 243, thereby providing a high voltage to the node 242. The nodes 244 and 245 are at a low voltage since, as described below, the repeater 224 provides a low voltage to the node 245, thereby providing a low voltage to the node 244. Finally, the node 246 is at a high voltage since the repeater 225 is an odd repeater and functions in the same manner as the repeater 223, thereby bringing the node 246 to the high voltage. Hence, each of the MRAM blocks 101, 202, and 203 are written to. Thus, the present invention allows to write to a large number of MRAM blocks.

The system occupies a relatively small area since the system includes only one decoder 221 for all MRAM blocks, unlike existing MRAM devices described above and that have one decoder for each MRAM block. Moreover, area occupied by the system is reduced since each of the repeaters 223–225 occupies a smaller area than that occupied by each of the drivers of existing MRAM devices.

Figure 3:
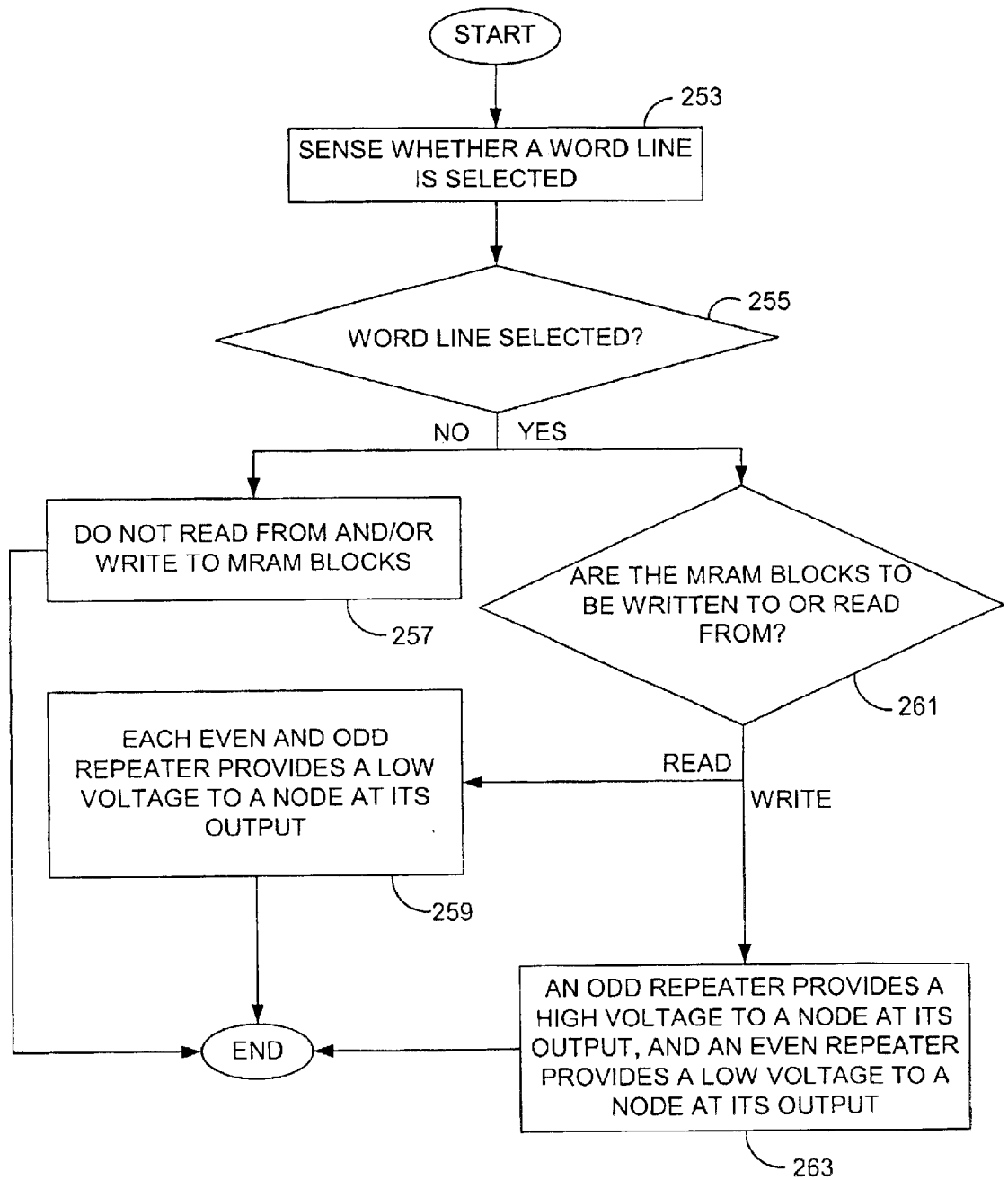
FIG. 3 is a flow chart of an embodiment of a method for communicating with memory blocks using the system of FIG. 2.

FIG. 3 is a flow chart of an embodiment of a method for communicating with memory blocks, specifically with the MRAM blocks 101, 202, and 203 (FIG. 2). Any descriptions of blocks in any flow chart of this disclosure should be understood as representing modules, segments, or portions of code which include one or more executable instructions for implementing specific logical functions or steps in a method, and alternate implementations are included within the scope of the preferred embodiment of the present invention in which functions may be executed out of order from that shown or discussed, including substantially concurrently or in reverse order, depending on the functionality involved, as would be understood by those reasonably skilled in the art of the present invention.

Beginning with block 253, the even and the odd repeaters of FIG. 2 sense whether a given word line, e.g. word line 105 (FIG. 2) is selected. Referring to decision block 255, if the word line 105 is not selected, the MRAM blocks 101, 202, 203 are not written to or read from in block 257. If the word line 105 is selected, there is a determination, at block 261, whether the MRAM blocks 101, 202, 203 are to be written to or read from. If the MRAM blocks 101, 202, 203 are to be read from, flow continues to block 259 at which each even and odd repeater of FIG. 2 provides a low voltage, which is preferably a ground voltage, to a node at its output. Alternatively, if the MRAM blocks 101, 202, 203 are to be written to, flow continues to block 263 at which each odd repeater of FIG. 2 provides a high voltage to a node at its output and each even repeater of FIG. 2 provides a low voltage to a node at its output.

FIG. 4 is a circuit diagram of an embodiment of even repeater, e.g., repeater 224, of the system of FIG. 2. The repeater 224 includes two access transistors, Q1 and Q2, a comparator 365, an AND gate 341, and a drive transistor Q3. The comparator 365, preferably, is a clocked latch. Alternatively, however, the comparator 365 can be a clocked flip-flop. The comparator 365 includes two clocked NOT gates 331 and 332, and a line 361 over which a test clock signal is applied. The line 361 is coupled to the access transistors Q1 and Q2. An alternative embodiment of the repeater 224 can include N-channel MOSFETs instead of the P-channel MOSFETs Q1 and Q2. Furthermore, another alternative embodiment of the repeater 224 may include a P-channel MOSFET in parallel with an N-channel MOSFET instead of each of the P-channel MOSFETS Q1 and Q2.

Figure 5A:
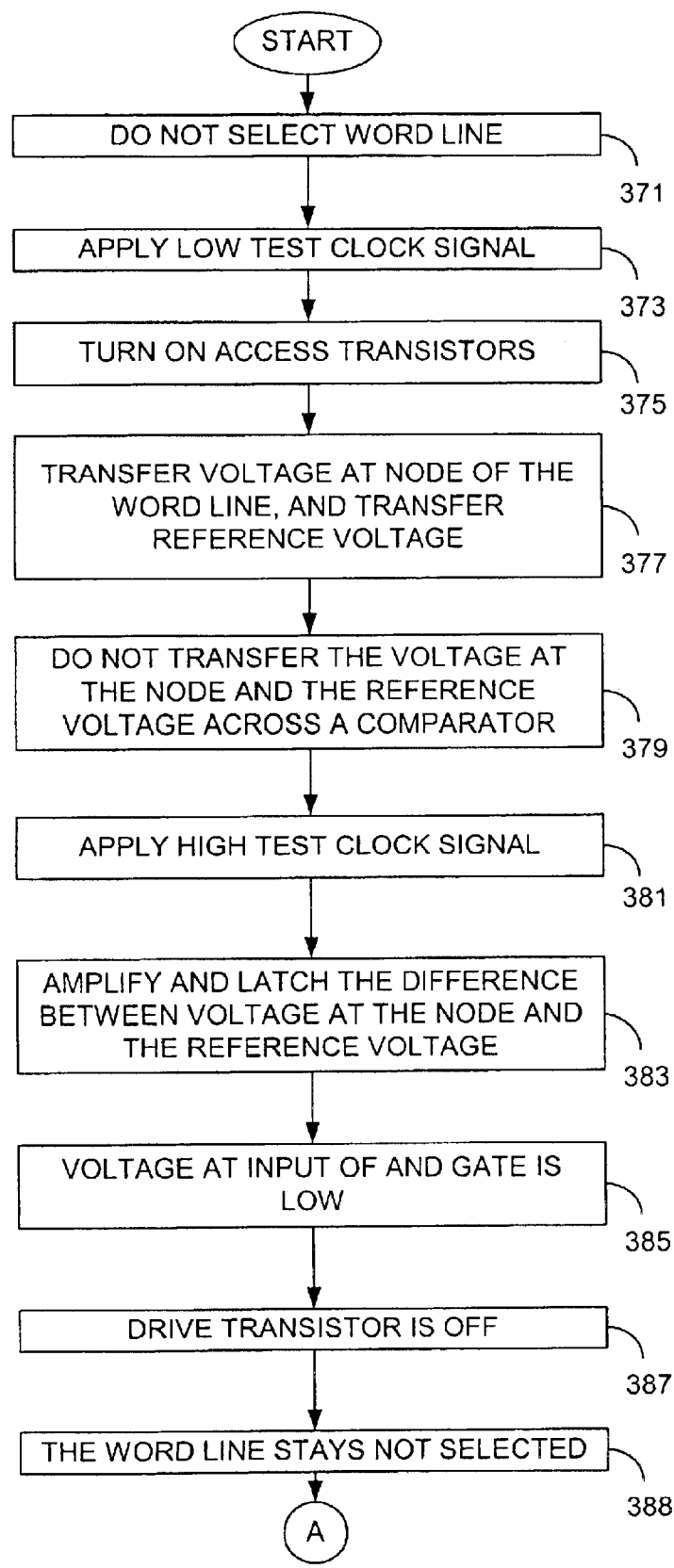
FIGS. 5A and 5B provide a flowchart of an example of operation of the even repeater of FIG. 4 facilitating communication with memory blocks.
Figure 5B:
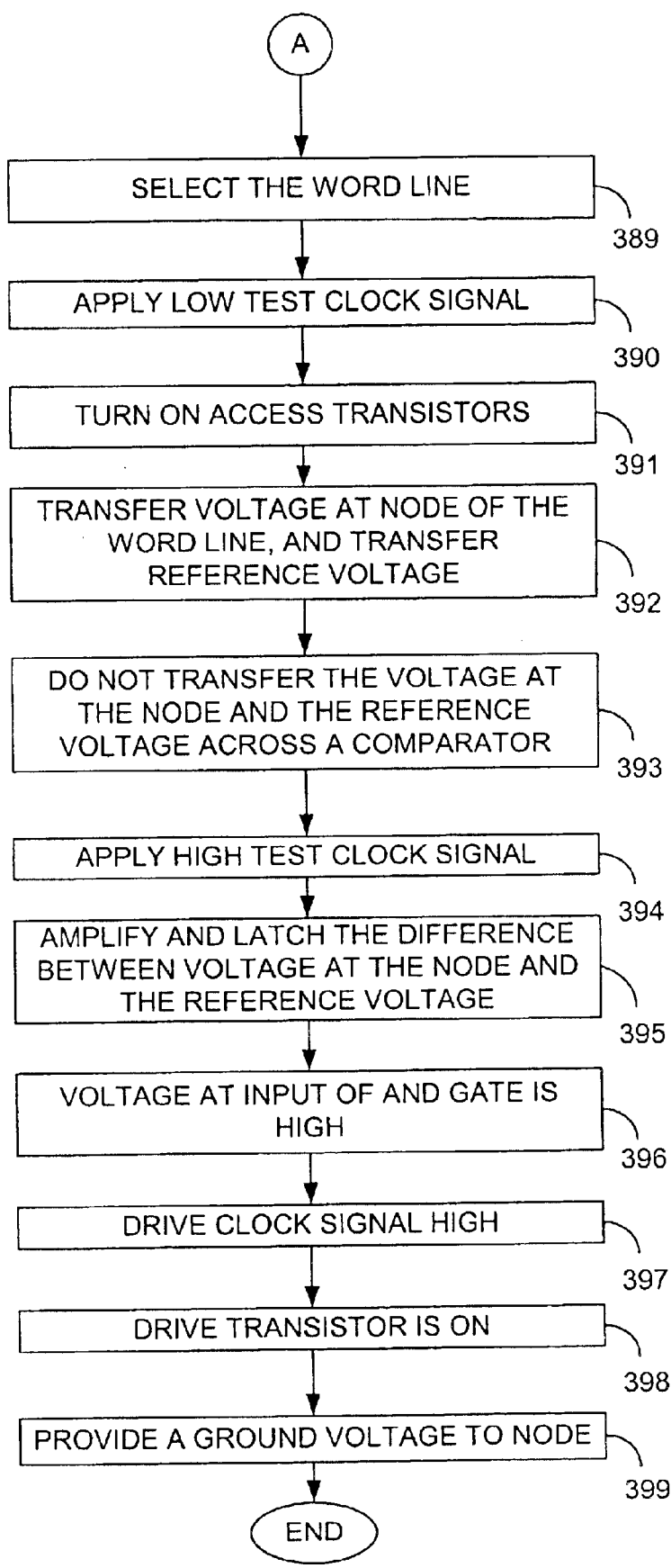

FIGS. 5A and 5B provide a flowchart of an example of operation of even repeater 224 of FIG. 4 facilitating communication with memory blocks by providing a low voltage to the node 245 (FIG. 4) at output of the repeater. All the even repeaters of the system of FIG. 2 may operate in this manner.

If the decoder 221 (FIG. 2) has not selected the word line 105 (FIG. 2), in step 371, the repeater 224 senses in steps 373–383 that the decoder 221 has not selected the word line 105, and so in steps 385–388, the repeater 224 does not provide a low voltage to the node 245. The decoder 221 can select the word line 105 by bringing the word line 105 to a high or a low voltage. In the system of FIG. 2, the decoder 221 selects the word line 105 by bringing the word line 105 to a low voltage, which is preferably a ground voltage. However, in an alternative embodiment of the repeater 224, the decoder 221 may select the word line 105 by bringing the word line 105 to a high voltage, and not select the word line 105 by bringing the word line to a low voltage.

In general, the repeater 224 senses that the word line 105 is not selected by comparing voltage at the node 244 (FIG. 4) to a reference voltage supplied over the line 351 (FIG. 4). When the word line 105 is not selected, the reference voltage is lower than the voltage at the node 244, and so the comparator 365 outputs a low voltage at the node 367 (FIG. 4).

The repeater 224 senses that the word line 105 is not selected, as follows. Suppose the word line 105 is not selected in step 371. Assume, as shown in step 373, that a test clock signal that is applied to the line 361 (FIG. 4), is low. The clocked NOT gates, 331 (FIG. 4) and 332 (FIG. 4) therefore are in a high impedance state and hence, in step 375, the access transistors Q1 and Q2 are on. If the word line 105 is not selected, the transistor Q1 (FIG. 4) draws a current 11 (FIG. 4), and so, in step 377, a high voltage at the node 244 is transferred across the transistor Q1 to the comparator 365. Similarly, a reference voltage over the line 351 is transferred across the transistor Q2 to the comparator 365 (FIG. 4). However, in step 379, the high voltage transferred across the transistor Q1 and the reference voltage transferred across the transistor Q2 (FIG. 4) does not get transferred across the comparator 365 since the test clock signal over the line 361 is low. The node 367, therefore, is equal to the reference voltage over the line 351.

When the test clock signal over the line 361 goes from low to high as indicated in step 381, the access transistors Q1 and Q2 turn off and isolate input nodes of the comparator 365 with the voltages transferred across the transistors Q1 and Q2. Furthermore, when the test clock signal over the line 361 goes from low to high, in step 383, the clocked NOT gates 331 and 332 switch from the high impedance state to a low impedance state to amplify the difference between the voltage at the node 244 and the reference voltage over the line 351. The difference is latched across the comparator 365, and the node 367 is at a low voltage. The node 367 is at a low voltage since the reference voltage side of comparator 365 is lowered to a ground voltage and the high voltage of the word line 105 side of comparator 365 is increased to a supply voltage that is provided to the repeater 224. It should be noted that the high voltage of the node 244 of the word line 105 is at a higher voltage than the reference voltage but is lower than the supply voltage. Furthermore, the reference voltage is higher than a ground voltage. Hence, the repeater 224 senses that the node 244 of the word line 105 is at a high voltage and so, the node 367 is at a low voltage.

The AND gate 341 provides a low voltage at its output since, in step 385, the node 367, which is one of the inputs of the AND gate 341 (FIG. 4), is at a low voltage. The AND gate 341 is off regardless of whether a drive clock signal over a line 363 is high or low. In step 387, the transistor Q3 is off since the AND gate 341 provides a low voltage at the output of the AND gate. A ground voltage is not provided to the node 245 because the transistor Q3 is off. The node 245 is therefore at the same voltage as the node 244, which is high, and so, in step 388, the word line 105 remains unselected.

As shown in FIG. 5B, if the decoder 221 selects the word line 105 in step 389, and the repeater 224 senses that the word line 105 is selected in steps 390–395, the repeater 224 provides a low voltage to the node 245, in steps 396–399. In general, the repeater 224 senses that the decoder 221 has selected the word line 105 by comparing voltage at the node 244 to the reference voltage supplied over the line 351. When the word line 105 is selected, the reference voltage is higher than the voltage at the node 244, and so the comparator 365 outputs a high voltage at the node 367.

The repeater 224 senses that the word line 105 is selected, as follows. Suppose that the word line 105 is selected in step 389 of FIG. 5B. Assuming that, in step 390, the test clock signal that is applied over the line 361, is low, the clocked NOT gates 331 and 332, therefore, are in a high impedance state, and hence the access transistors Q1 and Q2 are on in step 391. If the word line 105 is selected, the transistor Q1 draws a current $I_1$, and in step 392, a low voltage at the node 244 is transferred across the transistor Q1 to the comparator 365. Similarly, a reference voltage over the line 351 is transferred across the transistor Q2 to the comparator 365. However, as shown in step 393, the low voltage transferred across the transistor Q1 and the reference voltage transferred across the transistor Q2 does not get transferred across the comparator 365 since the test clock signal over the line 361 is low. The node 367, therefore, is equal to the reference voltage over the line 351.

When the test clock signal over the line 361 goes from low to high as shown in step 394, the access transistors Q1 and Q2 turn off and isolate input nodes of the comparator 365 with the voltages transferred across the transistors Q1 and Q2. Furthermore, when the test clock signal over the line 361 goes from low to high, in step 395, the clocked NOT gates 331 and 332 switch from the high impedance state to a low impedance state to amplify the difference between the voltage at the node 244 and the reference voltage over the line 351. The difference is latched across the comparator 365, and the node 367 is at a high voltage. The node 367 is at a high voltage since the comparator 365 increases voltage at the node 367 to the supply voltage. It should be noted that the low voltage of the word line 105 is lower than the reference voltage but is higher than the ground voltage. Furthermore, the reference voltage is lower than the supply voltage. The reference voltage lies between a low voltage at the node 244 when the word line 105 is selected and a high voltage at the node 244 when the word line 105 is not selected. Hence, the repeater 224 senses that the word line 105 is at a low voltage and so, the node 367 is at a high voltage.

The upper input of the AND gate 341 is high in step 396 since the node 367 is a node connected to the upper input of the AND gate 341. In step 397, if the drive clock signal over the line 363 is high, the AND gate 341 provides a high voltage at its output since the node 367 is at a high voltage. The transistor Q3 is on in step 398 since the AND gate 341 provides a high voltage at its output. A ground voltage is provided to the node 245 as indicated in step 399 because the transistor Q3 is on and draws a current $I_2$. The node 245, therefore, is at the same voltage as the node 244, which is low, and so the word line 105 stays selected.

FIG. 6 is a circuit diagram of an embodiment of the odd repeaters shown in the system of FIG. 2. By way of example, the odd repeater is repeater 223. As shown in FIG. 6, the repeater 223 can include the access transistors Q1 and Q2 (FIG. 4), a comparator 465, a NAND gate 471, an AND gate 473 with an inverted middle input, the transistor Q3 (FIG. 4) and a transistor Q4. The transistors Q3 and Q4 are drive transistors. In an alternative embodiment, an N-channel MOSFET can be used instead of the P-channel MOSFET Q4.

The comparator 465 includes the two clocked NOT gates 331 and 332 (FIG. 4), and a line 461 over which a test clock signal is applied. The line 461 is coupled to each of the access transistors Q1 and Q2. The comparator 465 is preferably a clocked latch. However, the comparator 465 can alternatively be a clocked flip-flop. A line 451 is provided for applying a reference voltage. In operation, the repeater 223 senses whether the word line 105 is selected in same manner in which the repeater 224 of FIG. 4 senses whether the word line 105 is selected.

Figure 7A:
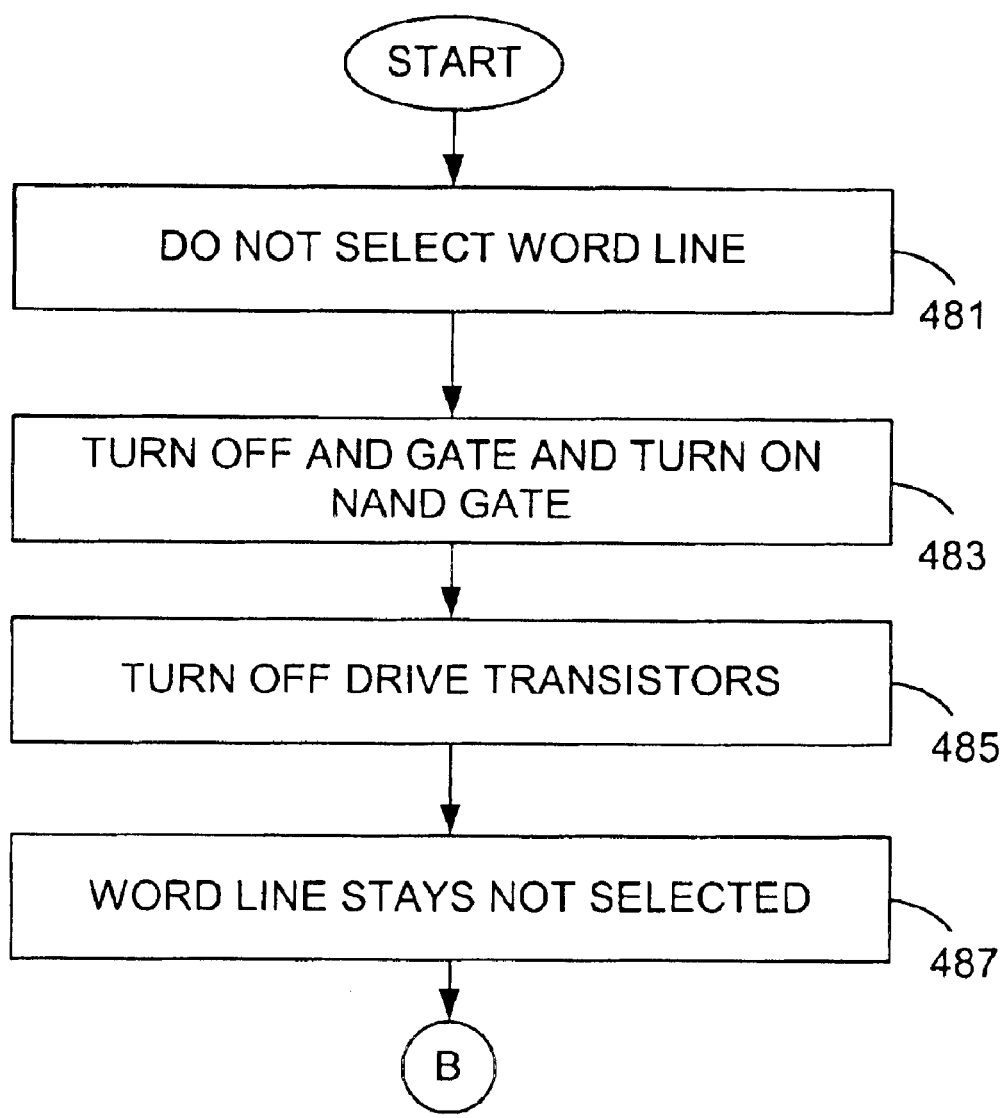
FIGS. 7A and 7B provide a flowchart of an example of operation of the odd repeater of FIG. 6 facilitating communication with memory blocks.
Figure 7B:
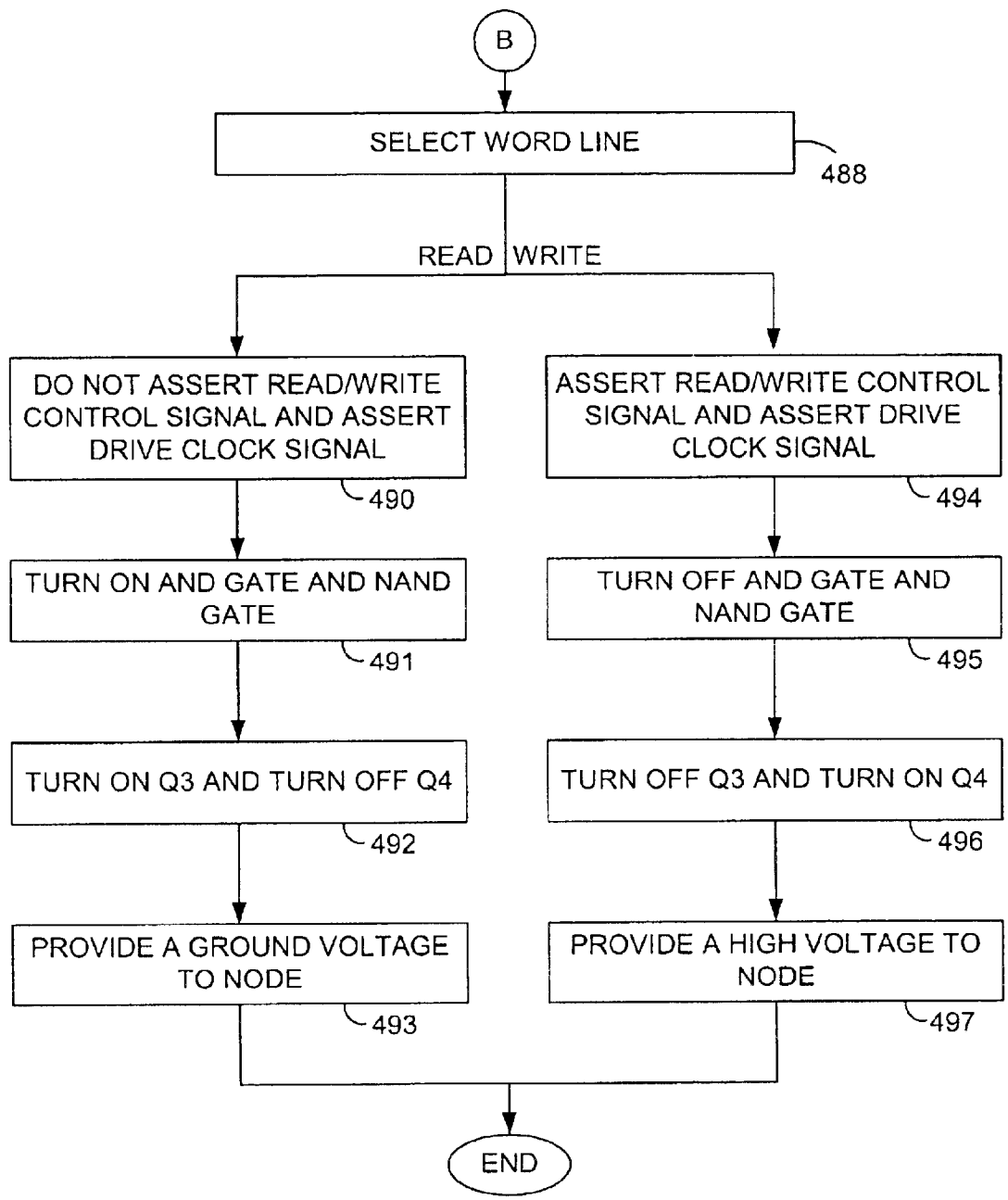

FIGS. 7A and 7B provide a flowchart of an example of operation of the odd repeater 223 of FIG. 6 facilitating communication with memory blocks by providing a voltage to the node 243 (FIG. 6) at output of the repeater 223. All the odd repeaters of the system of FIG. 2 can operate in the same manner as the repeater 223. When the word line 105 (FIG. 6) is not selected, the transistors Q3 and Q4 (FIG. 6) are off, and therefore the node 243 (FIG. 6) is at the same voltage as the node 242 (FIG. 6). The node 243, therefore, is at a high voltage since the node 242, preferably, is at a high voltage. To explain, when the word line 105 is not selected, as shown in step 481, a node 467 (FIG. 6) at the output of the comparator 465 (FIG. 6), is at a low voltage for the same reasons that the node 367 (FIG. 4) is at a low voltage when the word line 105 is not selected. The AND gate 473 (FIG. 6), therefore, is off in step 483, and hence the output of the AND gate 473 is at a low voltage. Moreover, the NAND gate 471 (FIG. 6) is on and so the output of the NAND gate 471 is at a high voltage. The transistors Q3 and Q4, therefore, are off in step 485, and hence the node 243 is at the same high voltage as the node 242. The word line 105, therefore, stays not selected as indicated in step 487.

When the word line 105 is selected, either a low voltage, which is preferably a ground voltage, or a high voltage supplied by a power source 475 (FIG. 6) is provided to the node 243. When a low voltage is provided to the node 243, the MRAM blocks 101, 202, and 203 (FIG. 2) are read, and when a high voltage is provided to the node 243, the MRAM blocks 101, 202, and 203 are written. To elaborate, when the word line 105 is selected, as shown in step 488 of FIG. 7B, the node 467 is at a high voltage for the same reasons that the node 367 is at a high voltage when the word line 105 is selected. If the MRAM blocks 101, 202, and 203 are to be read, in step 490, a read/write control signal is not asserted over a line 477 (FIG. 6), and a drive clock signal over a line 469 (FIG. 6) is asserted. The output of the AND gate 473, therefore, is high as shown in step 491, thereby turning on the transistor Q3 in step 492. Moreover, the output of the NAND gate 471 is high as indicated in step 491, thereby turning off the transistor Q4 in step 492. The transistor Q3 draws a current $I_5$ from the node 243, hence, providing a ground voltage to the node 243 in step 493.

If the MRAM blocks 101, 202, and 203 are to be written to, the word line 105 is selected, and the node 467 goes to a high voltage in the same manner that the node 367 goes to a high voltage when the word line 105 is selected. Moreover, in step 494, the read/write control signal over the line 477 is asserted, and the drive clock signal over the line 469 is asserted. The output of the AND gate 473 and the output of the NAND gate 471, hence, are low as shown in step 495. In step 496, the transistor Q3 is, therefore, off and the transistor Q4 is on. A current $I_4$ flows from the power source 475 to the node 243, thereby providing a high voltage to the node 243. In step 497, voltage at the node 242 is high since a high voltage is provided to the node 243 and the node 242 is directly connected to the node 243.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A memory device, comprising:
   a plurality of magnetic random access memory (MRAM) memory blocks each having at least two nodes;
   a plurality of odd and even repeaters arranged in an alternating configuration with the memory blocks such that each memory block is positioned between an odd and even repeater pair, the repeaters being configured to repeat both a control signal and a drive voltage; and
   a line that couples the memory blocks with the repeaters.

2. The device of claim 1, wherein the repeaters are configured to sense whether the line is selected, and if the line is selected, provide a voltage to the line.

3. The device of claim 1, wherein the line is configured by coupling word lines of the memory blocks to each other, a word line of one of the memory blocks having a same address as addresses of word lines of remaining memory blocks.

4. The device of claim 1, wherein the line couples a decoder, the repeaters, and the memory blocks, and wherein the memory blocks are in series with the repeaters and the decoder.

5. The device of claim 1, wherein a repeater comprises a comparator, access transistors, and at least one drive transistor, and wherein a repeater is configured to sense voltage at an output of each memory block, and to provide a voltage to each node of the line.

6. A memory device, comprising:
   a plurality of memory blocks each having at least two nodes;
   a plurality of odd and even repeaters arranged in an alternating configuration with the memory blocks such that each memory block is positioned between an odd and even repeater pair, one of the repeaters of each repeater pair providing a high voltage to a memory block node and the other providing a low voltage to another memory block node during a write process; and
   a line that couples the memory blocks to the repeaters such that the repeaters can write to the memory blocks.

7. The device of claim 6, wherein the memory blocks are magnetic random access memory (MRAM) blocks.

8. The device of claim 6, wherein at least one repeater of the repeater pair is configured to sense an output of an associated memory block and provide a voltage to the memory block.

9. The device of claim 6, wherein the line couples a decoder, the repeaters and the memory blocks, the memory blocks are in series with the repeaters and the decoder, and wherein a repeater is located adjacent to each memory block.

10. A method for communicating with a selected memory block of a memory device that includes a plurality of memory blocks, comprising:
    coupling the selected memory block to a pair odd and even repeaters; and
    writing to the selected memory block by providing a high voltage to the selected memory block with one of the odd and even repeaters and providing a low voltage to the selected memory block with the other of the odd and even repeaters.

11. The method of claim 10, wherein the memory blocks of the memory device are magnetic random access memory (MRAM) blocks.

12. The method of claim 10, wherein writing to the selected memory block comprises repeating a control signal and a drive voltage using one of the repeaters of a pair of odd and even repeaters.

* * * * *